(12) United States Patent
Hu et al.

(10) Patent No.: US 11,276,777 B2
(45) Date of Patent: Mar. 15, 2022

(54) SEMICONDUCTOR STRUCTURE AND METHOD FOR FORMING SAME

(71) Applicants: Semiconductor Manufacturing International (Shanghai) Corporation, Shanghai (CN); Semiconductor Manufacturing International (Beijing) Corporation, Beijing (CN)

(72) Inventors: Wang Hu, Shanghai (CN); Zhang Wei Hu, Shanghai (CN); Wang Shan Shan, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 17/101,169

(22) Filed: Nov. 23, 2020

(65) Prior Publication Data
US 2021/0343865 A1    Nov. 4, 2021

(30) Foreign Application Priority Data
Apr. 30, 2020 (CN) .......................... 202010363162.7

(51) Int. Cl.
*H01L 29/78* (2006.01)
*H01L 29/10* (2006.01)
*H01L 29/66* (2006.01)

(52) U.S. Cl.
CPC ...... *H01L 29/7816* (2013.01); *H01L 29/1095* (2013.01); *H01L 29/6653* (2013.01); *H01L 29/66681* (2013.01)

(58) Field of Classification Search
None
See application file for complete search history.

(56) References Cited

U.S. PATENT DOCUMENTS

| 2015/0145034 A1* | 5/2015 | Lee | H01L 29/0878 257/336 |
| 2015/0206968 A1* | 7/2015 | Cascino | H01L 29/0882 257/339 |

(Continued)

*Primary Examiner* — Ali Naraghi
(74) *Attorney, Agent, or Firm* — Crowell & Moring LLP

(57) ABSTRACT

A semiconductor structure and a method for forming same are provided. The forming method includes: forming an initial gate covering a second region and extending to cover a part of a first region; forming a drain region in the first region on a side of the initial gate; forming a protective film conformally covering the drain region, a top surface and a side wall of the initial gate, and a surface of a base; removing a partial width of the protective film and a partial width of the initial gate of the second region to form a protective layer, a gate, and an opening enclosed by a side wall of the gate and a partial width of the base of the second region, the gate covering a junction between the second region and the first region; performing first doping on the base under the opening to form a body region; performing second doping on the base under the opening to form a doped region, the doped region including a sacrificial doped region and a source region between the sacrificial doped region and the gate; and etching the sacrificial doped region and a partial thickness of the base under the sacrificial doped region by using the protective layer as a mask, and forming a trench in the body region, a side wall of the trench exposing the source region. Embodiments of the present disclosure can improve performance of an LDMOS device.

10 Claims, 4 Drawing Sheets

(56) References Cited

U.S. PATENT DOCUMENTS

2018/0026134 A1\* 1/2018 Eikyu ................. H01L 29/4236
                                                            257/330
2019/0386117 A1\* 12/2019 Lee ..................... H01L 29/1095
2020/0251591 A1\* 8/2020 Song ................. H01L 29/66484

\* cited by examiner

SEMICONDUCTOR STRUCTURE AND METHOD FOR FORMING SAME

RELATED APPLICATIONS

The present application claims priority to Chinese Patent Appln. No. 202010363162.7, filed Apr. 30, 2020, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming same.

Related Art

With the rapid development of semiconductor manufacturing technologies, semiconductor devices are developed toward a direction of higher element density, higher integration, and higher performance. A power semiconductor device is a high-power electronic device (usually with a current of tens to thousands of amps and a voltage of hundreds of volts or above) mainly used for power conversion of power equipment and a control circuit.

A laterally diffused metal oxide semiconductor (LDMOS), a power device with a double-diffusion structure, is usually used in a radio frequency power circuit. In a high-voltage power integrated circuit, a high-voltage LDMOS is often used to meet requirements of high voltage resistance and achievement of power control. The laterally diffused metal oxide semiconductor (LDMOS) is characterized with many advantages, such as relatively high thermal stability and frequency stability, relatively good gain and durability, a relatively low feedback capacitance and thermal resistance, and a constant input impedance and a simpler bias current circuit. In addition, the LDMOS may further be well compatible with CMOS, and therefore the LDMOS is being widely used.

In the LDMOS, a drift region is usually disposed between a source region and a drain region. An impurity concentration of the drift region is relatively low. When the LDMOS is connected to a high voltage, the drift region is able to withstand a higher voltage because the drift region has high resistance. In order to take into account high resistance to breakdown and a fast response speed, a general solution is to implant and/or use a planar body or a trench body in the drift region.

SUMMARY

Embodiments and implementations of the present disclosure provide a semiconductor structure and a method for forming same to improve performance of an LDMOS device, simplify working procedures, shorten a process cycle, and reduce process costs.

One form of the present disclosure provides a method for forming a semiconductor structure, including: providing a base including a first region in which a drift region is formed and a second region in which a body region is formed, the first region being adjacent to the second region; forming an initial gate on the base, the initial gate covering the second region and extending to cover a part of the first region; forming a drain region in the first region on a side of the initial gate; forming a protective film conformally covering the drain region, a top surface and a side wall of the initial gate, and a surface of the base; removing a partial width of the protective film and a partial width of the initial gate of the second region to form a protective layer, a gate, and an opening enclosed by a side wall of the gate and a partial width of the base of the second region, the gate covering a junction between the second region and the first region; performing first ion doping on the base under the opening and forming a body region in the base of the second region; performing second ion doping on the base under the opening, a doping type of the second ion doping being different from a doping type of the first ion doping, and forming a doped region in the body region under the opening, the doped region including a sacrificial doped region and a source region between the sacrificial doped region and the gate; and etching the sacrificial doped region and a partial thickness of the base under the sacrificial doped region by using the protective layer as a mask, and forming a trench in the body region, a side wall of the trench exposing the source region.

Another form of the present disclosure further provides a semiconductor structure, including: a base including a drift region and a body region adjacent to each other; a gate located on the base and covering a junction between the drift region and the body region, a part of the base being exposed on both sides of the gate; a drain region located in the drift region on a side of the gate; a protective layer conformally covering the drain region, a top surface of the gate, and a side wall that is of the gate and that is adjacent to the drain region; an opening enclosed by the side wall of the gate and a partial width of base of the body region; a source region located in a part of the body region under the opening and adjacent to the gate; and a trench located in the base of the partial thickness of the body region exposed by the protective layer and the source region, a side wall of the trench exposing the source region.

Compared to the prior art, the technical solutions of the embodiments and implementations of the present disclosure have the following advantages.

In one form of a method for forming a semiconductor structure according to an embodiment of the present disclosure, after the body region and the source region are formed, the sacrificial doped region and a partial thickness of the base under the sacrificial doped region are etched by using the protective layer as the mask, and a trench is formed in the body region, a side wall of the trench exposing the source region. Therefore, in embodiments and implementations of the present disclosure, by forming of the trench body, when the semiconductor structure is in operation, the carrier may be transmitted not only through the surface of the base, but also through the side wall of the trench, helping to transfer more carriers and improving a carrier mobility, further helping to reduce an on-resistance of the device and improving a response speed of the device, and correspondingly improving performance of the LDMOS device.

In addition, in embodiments and implementations of the present disclosure, after the drain region is formed, the protective film is further formed, and after the partial width of the protective film and the partial width of the initial gate of the second region, the protective layer is formed. The protective layer may be used as a mask during first ion doping, second ion doping, and trench formation, helping to simplify a process flow and shorten a process cycle. Moreover, by forming of the protective layer, no additional mask is required during the first ion doping, the second ion doping, and the trench formation in the present disclosure, helping to save process costs and shorten a process cycle, and helping to prevent overlay shift generated during a photolithography process, further helping to reduce a process difficulty and increase a process window.

In some implementations, before the trench is formed, the method for forming a semiconductor structure further includes: forming a spacer on a side wall of the opening, a bottom of the spacer covering the source region and exposing the sacrificial doped region. By forming of the spacer, the sacrificial doped region and the base under the sacrificial doped region may be etched using the protective layer and the spacer as masks to form the trench. Correspondingly, during forming of the trench, no additional mask is required, helping to prevent overlay shift generated during the photolithography process, further reducing production costs, shortening a process cycle, and reducing a processing difficulty and increasing a process window.

In some implementations, the step of forming the spacer includes: a spacer film conformally covering the protective layer, the side wall of the opening, and the base under the opening is formed. The spacer film located on the protective layer and on the base under the opening is removed, and the spacer film located on the side wall of the opening is reserved as the spacer. Therefore, by forming of the protective layer, the protective layer may be used as a stop layer during the removal of the spacer film on the protective layer and the base under the opening, so that no additional mask is required during forming of the spacer, helping to prevent overlay shift generated during the photolithography process, thereby helping to reduce production costs, shorten a process cycle, reduce a process difficulty, and increase a process window.

DETAILED DESCRIPTION

Current LDMOS devices still have a problem with poor performance. An LDMOS device having a planar body is used as an example for analysis and description in the following.

Figure 1:
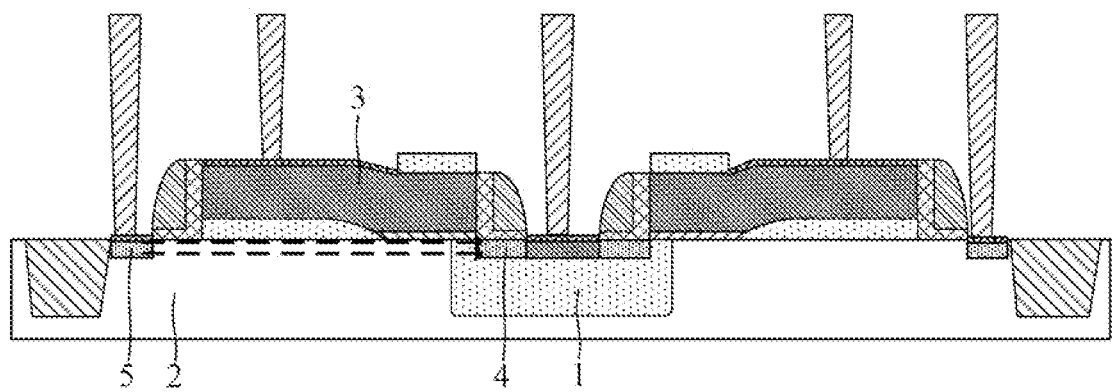
FIG. 1 is a schematic sectional structural diagram of a semiconductor structure.

Referring to FIG. 1, a schematic sectional structural diagram of a semiconductor structure is shown.

The semiconductor structure includes: a base (not labelled) including a body region 1 and a drift region 2 adjacent to each other; a gate 3 located on the base and covering a junction between the body region 1 and the drift region 2, and a part of the base being exposed on both sides of the gate 3; a source region 4 located in the body region 1 on a side of the gate 3; and a drain region 5 located in the drift region 2 on the other side of the gate 3.

The semiconductor structure is an LDMOS device having a planar body. In the semiconductor structure, a carrier is transmitted only through a surface of the base (as shown by a dotted arrow in FIG. 1). A carrier mobility of the semiconductor structure is relatively low, resulting in a slow response speed of the semiconductor structure and poor performance of the LDMOS device. Moreover, as the power semiconductor device LDMOS is increasingly widely applied, and high resistance to breakdown and a fast response speed needs to be considered, it is increasingly difficult for the semiconductor structure to meet the performance requirements of the LDMOS device.

It can be seen from the background art that one solution is to adopt a trench body in LDMOS. However, a current process for forming the LDMOS with the trench body is relatively complex with high costs, and the device performance needs to be further improved.

In order to resolve the technical problem, in one form of a method for forming a semiconductor structure according to the present disclosure, after the body region and the source region are formed, the sacrificial doped region and a partial thickness of the base under the sacrificial doped region are etched using the protective layer as the mask, and a trench is formed in the body region, a side wall of the trench exposing the source region. Therefore, in embodiments and implementations of the present disclosure, by forming of the trench body, when the semiconductor structure is in operation, the carrier may be transmitted not only through the surface of the base, but also through the side wall of the trench, helping to transfer more carriers and improving a carrier mobility, further helping to reduce an on-resistance of the device and improving a response speed of the device, and correspondingly improving performance of the LDMOS device. In addition, in embodiments and implementations of the present disclosure, after the drain region is formed, the protective film is further formed, and after the partial width of the protective film and the partial width of the initial gate of the second region are removed, the protective layer is formed. The protective layer may be used as a mask during first ion doping, second ion doping, and trench formation, helping to simplify a process flow and shorten a process cycle. Moreover, by forming of the protective layer, there is no need to use an additional mask during the first ion doping, the second ion doping, and the trench formation in the present disclosure, helping to save process costs and prevent overlay shift generated during a photolithography process, further helping to reduce a process difficulty and increase a process window.

In order to make the foregoing objectives, features, and advantages of embodiments and implementations of the present disclosure more apparent and easier to understand, the specific embodiments and implementations of the present disclosure are described in detail below with reference to the drawings.

FIG. 2 to FIG. 10 are schematic sectional structural diagrams corresponding to steps in one form of a method for forming a semiconductor structure according to the present disclosure.

Figure 2:
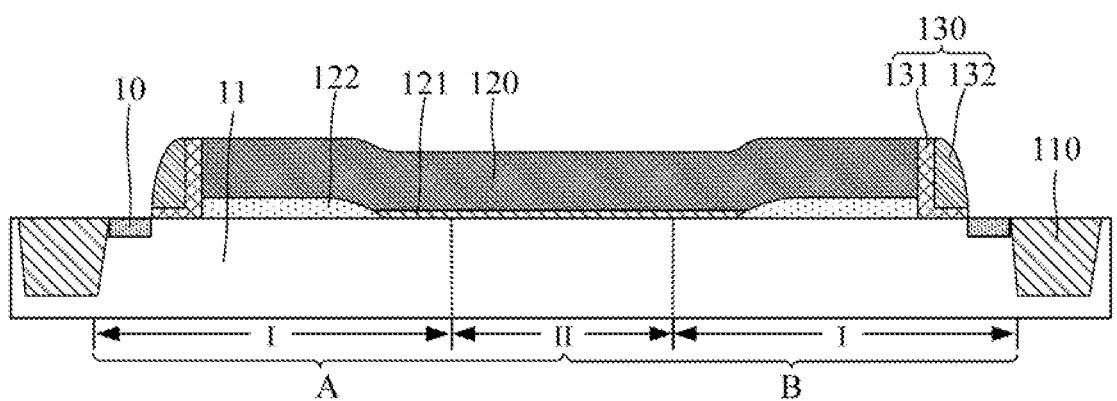
FIG. 2 to FIG. 10 are schematic sectional structural diagrams corresponding to steps in one form of a method for forming a semiconductor structure according to the present disclosure.

Referring to FIG. 2, a base is provided, including a first region I for forming a drift region and a second region II for forming a body region, the first region I being adjacent to the second region II.

The base is configured to provide a process platform for forming an LDMOS device.

As an example, the base is configured to form an N-type LDMOS transistor. In other implementations, the base may further be configured to form a P-type LDMOS transistor.

In some implementations, the base is a planar base. In other implementations, the base may further be a three-dimensional base, for example: the base includes a substrate and a fin separated on the substrate.

As an example, the base is a silicon substrate. In other implementations, the base may also be made of other materials such as germanium, silicon germanide, silicon carbide, gallium arsenide, indium gallium, or the like. The base may also be other types of bases such as a silicon base on an insulator or a germanium base on an insulator. The base may be made of a material suitable for process requirements or easy to be integrated.

The first region I is used to form a drift region, and the second region II is used to form a body region.

In some implementations, in a step of providing a base, the base in the first region I and the second region II is doped with ions, and the doped ions are the same as doped ions of an LDMOS transistor. The base of the first region I is used as a drift region 11. Correspondingly, In some implementations, in the step of providing a base, the drift region 11 is formed.

An ion doping concentration in the drift region 11 is relatively low, so that a resistance of the drift region 11 is relatively high, and thus has a relatively high voltage withstand capability.

A type of a doped ion in the drift region 11 is the same as a type of a doped ion of the LDMOS transistor. In some implementations, the base is configured to form an N-type LDMOS transistor, and the doped ion in the drift region 11 is an N-type ion. In other implementations, when a P-type LDMOS transistor is formed, a doped ion in the drift region is a P-type ion.

In some implementations, the base in the second region II is subsequently doped to form a body region.

In some implementations, the base includes a first sub-device region A and a second sub-device region B adjacent to each other. Both the first sub-device region A and the second sub-device region include the first region I and the second region II, and the first sub-device region A and the second sub-device region B share the second region II.

The first sub-device region A is used to form a first sub-device, the second sub-device region B is used to form a second sub-device, the first sub-device region A and the second sub-device region B sharing the second region II. Subsequently, after a body region is formed in the second region II, the first sub-device A and the second sub-device B share the body region, helping to reduce an area occupied by the semiconductor structure.

In some implementations, the first sub-device region A and the second sub-device region B constitute a device unit region.

In some implementations, an isolation structure 110 is further formed in a base on a periphery of the device unit region to be used to isolate adjacent device unit regions. In some implementations, the isolation structure 110 is made of silicon oxide.

Still referring to FIG. 2, an initial gate 120 is formed on the base. The initial gate 120 covers the second region I, and the initial gate 120 further extends to cover a part of the first region I.

After a partial width of the initial gate 120 that is located in the second region II and that is away from the first region I is subsequently removed, a remaining initial gate 120 is used as a gate.

As an example, in some implementations, the initial gate 120 is made of polysilicon.

In some implementations, the step of forming the initial gate 120 include: a gate material layer (not shown) covering the base is formed; a gate mask layer (not shown) is formed on the gate material layer; the gate material layer is patterned by using the gate mask layer as a mask to form the initial gate 120; and the gate mask layer is removed.

In some implementations, before the initial gate 120 is formed, the method for forming a semiconductor structure further includes: a first oxide layer 121 located in the second region II and extending to cover a part of the first region I and a second oxide layer 122 located in the first region I and adjacent to the first oxide layer 121 are formed on the base. A thickness of the second oxide layer 122 is greater than a thickness of the first oxide layer 121.

The first oxide layer 121 and the second oxide layer 122 are configured to achieve electric isolation between the gate and the base.

A subsequent step further includes: a drain region is formed in the first region I on a side of the initial gate 120. Compared with the first oxide layer 121, the second oxide layer 122 is closer to the drain region. The drain region is usually connected to a relatively high voltage. A thickness of the second oxide layer 122 is greater than a thickness of the first oxide layer 121, so that it is more difficult to break down a region between a gate close to the drain region and the base, helping to improve capability of resistance to breakdown of the device and correspondingly improving reliability of the device.

In some implementations, the first oxide layer 121 and the second oxide layer 122 are made of silicon oxide.

Still referring to FIG. 2, in some implementations, the method for forming a semiconductor structure further includes: a spacer structure layer 130 is formed on a side wall of the initial gate 120.

The spacer structure layer 130 is configured to protect the side wall of the initial gate 120, and the spacer structure layer 130 is further configured to define a region in which the drain region is formed. Therefore, the spacer structure layer 130 also exposes a part of the drift region 11, thereby making preparation for forming a drain region in the drift region 11 on a side of the initial gate 120.

The spacer structure layer 130 is made of one or more of silicon oxide, silicon nitride, silicon carbide, silicon carbide nitride, silicon oxycarbonitride, silicon oxynitride, boron nitride, and boron carbonitride, and the spacer structure layer 130 may be a single-layer structure or a laminated-layer structure. In some implementations, the spacer structure layer 130 is a laminated-layer structure. The spacer structure layer 130 includes a first spacer layer 131 located on the side wall of the initial gate 120 and also extending to a part of the base, and a second spacer layer 132 located on the first spacer layer 131. The second spacer layer 132 covers the first spacer layer 131 located on the base. The first spacer layer 131 and the second spacer layer 132 are made of silicon oxide, silicon nitride, silicon carbide, silicon carbonitride, silicon oxycarbonitride, silicon oxynitride, boron nitride, or boron carbonitride.

Still referring to FIG. 2, a drain region 10 is formed in the first region I on a side of the initial gate 120.

In particular, the drain region 10 is formed in the drift region 11 on the side of the initial gate 120. A type of a doped ion in the drain region 10 is the same as a type of a doped ion of an LDMOS transistor.

In some implementations, the base is configured to form an N-type LDMOS transistor, and the doped ion in the drain region 10 is an N-type ion. The N-type ion includes a P ion, an As ion, or a Sb ion. In other implementations, when a P-type LDMOS transistor is formed, the doped ion in the drain region is a P-type ion. The P-type ion includes a B ion, a Ga ion, or an In ion.

In some implementations, the step of forming the drain region 10 includes: third ion doping is performed, by using the initial gate 120 and the spacer structure layer 130 as masks, on the base in the first region I to form the drain region 10. In particular, the third ion doping is performed, by using the initial gate 120 and the spacer structure layer 130 as the masks, on the base in the first region I.

Figure 3:
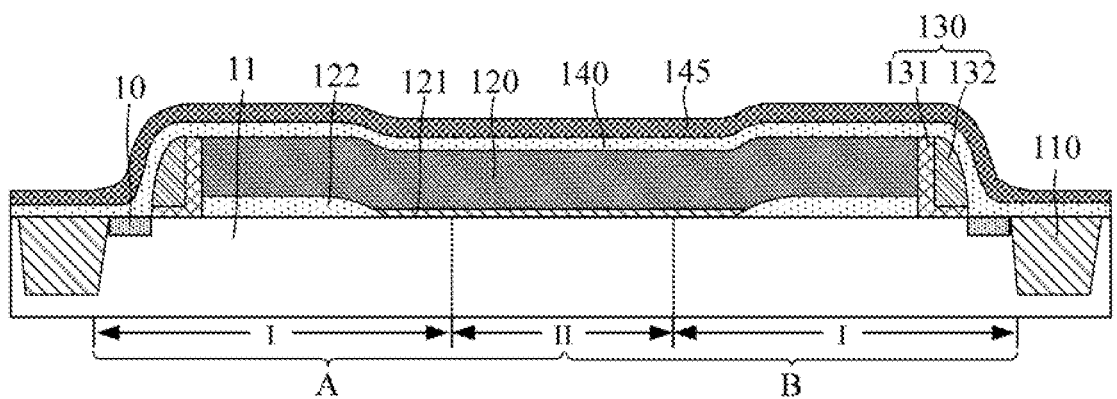

Referring to FIG. 3, a protective film 145 conformally covering the drain region 10, a top surface and a side wall of the initial gate 120, and a surface of the base is formed. The protective film 145 is configured to protect the top surface of the initial gate 120 and the drain region 10.

A subsequent step further includes: a partial width of the initial gate 120 that is located in the second region II and that is away from the first region I is removed to form an opening enclosed by a side wall on the other side of a remaining initial gate 120 and a partial width of the base that is located in the second region II and that is away from the first region I, the remaining initial gate 120 being used as a gate; and by forming of the protective film 145, in the step of forming the gate, the protective film 145 that is located in the second region II and that is away from the first region I is further removed, the remaining protective film 145 being used as a protective layer.

After the protective layer is formed, a subsequent step further include: first ion doping is performed on the base under the opening, and a body region is formed in the base of the second region II; a second ion doping is performed on the base under the opening to form a doped region in the body region under the opening, the doped region including a sacrificial doped region and a source region between the sacrificial doped region and the gate.

In addition, a subsequent step further includes: after the doped region is formed, a spacer is formed on a side wall of the opening, a bottom of the spacer covering the source region and exposing the sacrificial doped region. A step of forming the spacer film include: the spacer film is formed on the top surface and the side wall of the gate, the drain region 10, and the base at the bottom of the opening; and the spacer film located on the drain region 10, the top surface of the gate, and the base at the bottom of the opening is removed, and the spacer film located on the side wall of the opening is reserved as a spacer.

By forming of the protective layer, in the step of forming the spacer, the spacer film may be formed on the protective layer, and on the side wall and at the bottom of the opening. In the step of removing the spacer film located on the drain region 10, the top surface of the gate, and at the bottom of the opening, the protective layer may be used as a barrier layer, so that no additional mask is required, helping to prevent overlay shift generated during the photolithography process, further helping to reduce process costs and increasing a process window for forming the spacer without an additional mask, helping to simplify process steps and shorten a process cycle.

In addition, a subsequent step further includes: the sacrificial doped region and a partial thickness of the base under the sacrificial doped region are etched to form a trench in the body region; the protective layer may further serve together with the spacer as a mask for subsequently etching of the sacrificial doped region and the partial thickness of the base under the sacrificial doped region, so that no additional mask is required to form the trench, helping to prevent the overlay shift generated during the photolithography process, further helping to reduce the process costs and increasing the process window for forming the trench, without forming an additional mask, and further helping to simplify the process steps and shorten the process cycle.

In some implementations, the protective film 145 is made of silicon nitride. The silicon nitride, the material of the base, and the material of the gate have relatively etching selectivity, helping to ensure that a subsequent protective layer may protect the gate and the base.

The protective layer may be used as a mask for the subsequent first ion doping and the second ion doping, and the protective layer may be used as a barrier layer in a subsequent etching process for forming the spacer. In addition, the protective layer is further used as a mask for subsequently etching the sacrificial doped region and a partial thickness of the base under the sacrificial doped region to form a trench. An etching process for forming the spacer and an etching process for forming the trench also consumes a partial thickness of the protective layer to ensure that the protective layer may play a protective role sufficiently. Therefore, during forming of the protective film 145, a thickness of the protective film 145 should not be excessively small. However, the protective layer needs to be removed subsequently. In order to reduce a difficulty in a subsequent removal of the protective layer, during the forming of the protective film 145, a thickness of the protective film 145 should not be excessively large. As an example, in some implementations, the thickness of the protective film 145 is 500 Å to 2000 Å. Preferably, the thickness of the protective film 145 is 900 Å to 1100 Å.

In some implementations, the process of forming the protective film 145 includes a chemical vapor deposition process. The chemical vapor deposition process has low costs and high process compatibility.

Still referring to FIG. 3, in some implementations, before the protective film 145 is formed, the method for forming semiconductor structure further includes: a buffer layer 140 conformally covering the drain region 10, the top surface and the side wall of the initial gate 120, and the surface of the base is formed. Correspondingly, the protective film 145 is formed on the buffer layer 140.

The protective layer may be removed subsequently, and the buffer layer 140 may be used as a stop layer during the subsequent removal of the protective layer, thereby protecting the gate and the base. In addition, a third silicide layer is formed on the top surface of the gate subsequently. By forming of the buffer layer 140, a part of the buffer layer 140 is reserved according to actual needs after the protective layer is subsequently removed, thereby defining a region for forming the third silicide layer.

In some implementations, the buffer layer 140 is made of silicon rich oxide (SRO).

In some implementations, the buffer layer 140 is formed through a deposition process, for example: a chemical vapor deposition process, etc.

Figure 4:
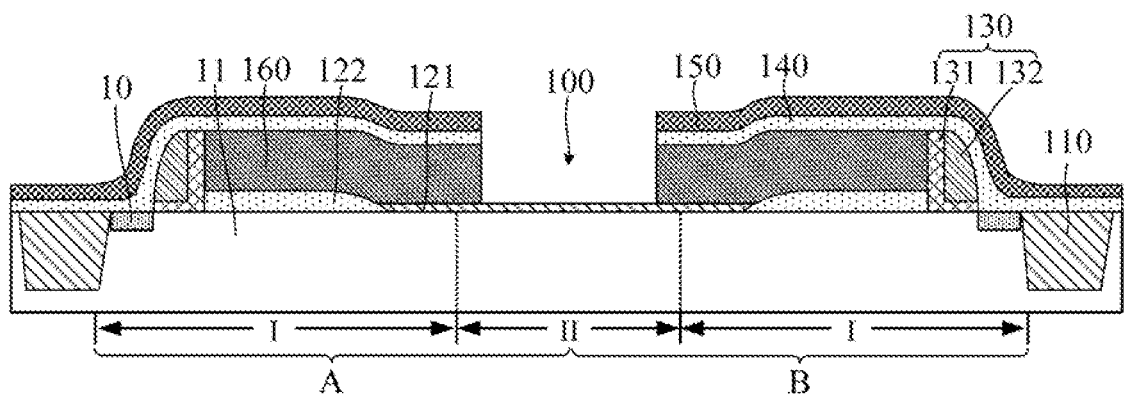

Referring to FIG. 4, a partial width of the protective film 145 and a partial width of the initial gate 120 of the second region II is removed to form a protective layer 150, a gate 160, and an opening 100 enclosed by a side wall of the gate 160 and a partial width of the base of the second region II, the gate 160 covering a junction between the second region II and the first region I.

In particular, a partial width of the initial gate 120 that is located in the second region II and that is away from the first region I is removed to form the opening 100 enclosed by the side wall on the other side of a remaining initial gate 120 and the partial width of the base that is of the second region II and that is away from the first region, the remaining initial gate 120 being used as the gate 160.

The partial width of the initial gate 120 of the second region II is removed to form the opening 100, thereby exposing a base of the second region II to make preparation for subsequently forming a body region in the base of the second region II.

When the device is in operation, the gate 160 is configured to control opening or closing of a conductive channel.

The gate 160 covers a junction between the second region II and the first region I, so that a part of the body region covered by the gate 160 is used as an effective channel region.

In some implementations, a side wall of an opening 100 of a first sub-device region A is in communication with a side wall of an opening 100 of a second sub-device region A.

In some implementations, in the step of removing the partial width of the initial gate 120 that is located in the second region II and that is away from the first region I, the partial width of the protective film 145 that is located in the second region II and that is away from the first region I is removed, and the remaining protective film 145 is used as a protective layer 150, so that the gate 160 and the protective layer 150 are formed in a same process step, helping to improve process integration and process compatibility, and further helping to simplify a process flow.

In some implementations, the step of removing a partial width of the protective film 145 and a partial width of the initial gate 120 that are located in the second region II and that are away from the first region I includes: a mask layer (not shown) is formed on the protective film 145, and a mask opening exposing a part of a top surface located on the protective film 145 of the second region II is formed in the mask layer; and the protective film 145, the buffer layer 140, and the initial gate 120 are etched along the mask opening by using the mask layer as a mask.

The mask layer is made of photoresist, and the mask layer may be formed through photolithography processes such as photoresist coating, exposure, and development.

In some implementations, a dry etching process is used, for example: in an anisotropic dry etching process, the protective film 145, the buffer layer 140, and the initial gate 120 are sequentially etched along the mask opening.

In some implementations, a first oxide layer 121 is exposed at a bottom of the opening 100. The first oxide layer 121 may reduce damage to the base during subsequent first ion doping and second ion doping.

Figure 5:
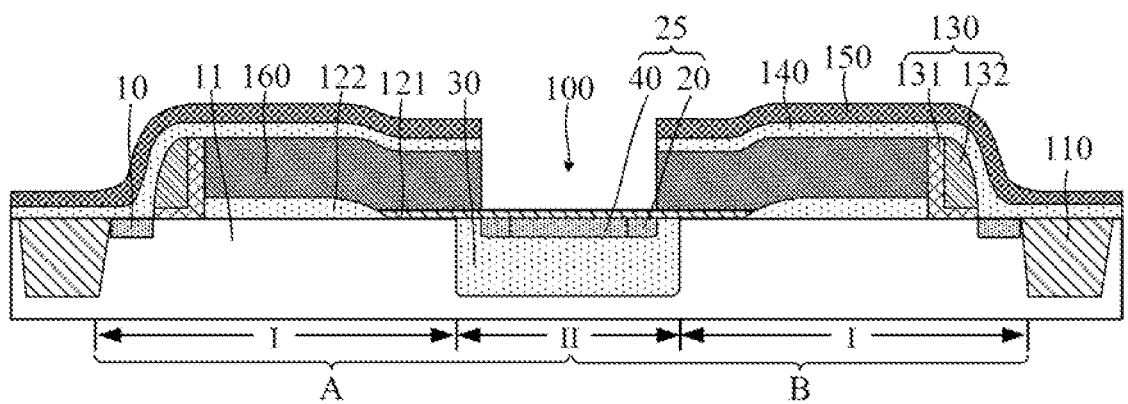

Referring to FIG. 5, first ion doping is performed on the base under the opening 100 to form a body region 30 in the base in the second region II. The body region 30 is configured to form a conductive channel with a concentration gradient. In particular, a part that is of the body region 30 and that is covered by the gate 160 is configured to form an effective channel region.

In some implementations, the first ion doping is performed on the base under the opening 100 by using the protective layer 150 as a mask. Therefore, during the first ion doping, no additional mask is used, helping to prevent overlay shift between the mask and the opening 100 during the photolithography process, and helping to reduce process costs. In some implementations, an ion implantation process is used to perform the first ion doping.

In some implementations, first ion doping is performed on the base under the opening 100. Ions further diffuse into a part of the base at the bottom of the gate 160 adjacent to the opening 100, to form a body region 30 in the base of the second region II.

A type of a doped ion in the body region 30 is different from a type of a doped ion of the LDMOS transistor. In some implementations, the base is configured to form an N-type LDMOS transistor, and a doped ion in the body region 30 is a P-type ion. In other implementations, when a P-type LDMOS transistor is formed, the doped ion in the body region is correspondingly the N-type ion.

Still referring to FIG. 5, second ion doping is performed on the base under the opening 100. A doped type of the second ion doping is different from a doped type of the first ion doping. A doped region 25 is formed in the body region 30 under the opening 100, including a sacrificial doped region 40 and a source region 20 between the sacrificial doped region 40 and the gate 160.

In some implementations, a doping depth of the second ion doping is smaller than a doping depth of the first ion doping. The source region 20 is used as a source of the LDMOS device.

In some implementations, in the step of performing the second ion doping, second ion doping is performed on the base under the opening 100 by using the protective layer 150 as a mask. Correspondingly, In some implementations, no additional mask is formed for the second ion doping, helping to prevent overlay shift during the photolithography process, thereby helping to reduce process costs and increasing a process window, and helping to shorten a process cycle.

A doping type of the second ion doping is different from a doping type of the first ion doping. In some implementations, an N-type LDMOS transistor is formed, and a doped ion in the second ion doping is an N-type ion. The N-type ion includes a P-type ion, an As ion, or a Sb ion. In other implementations, when a P-type LDMOS transistor is formed, a doped ion in the second ion doping is the P-type ion. The P-type ion includes a B ion, a Ga ion, or an In ion.

In some implementations, an ion implantation process is used to perform the second ion doping.

It should be noted that in some implementations, implantation energy, and an implantation dose and angle of the ion implantation process for performing the second ion doping is adjusted, so that a doping depth of the second ion doping is smaller than a doping depth of the first ion doping, further causing a doped region 25 to be located in the body region 30.

A subsequent step further includes: the sacrificial doped region 40 and a partial thickness of the base under the sacrificial doped region 40 are etched, and a trench is formed in the body region 30, a side wall of the trench exposing the source region 20.

Figure 6:
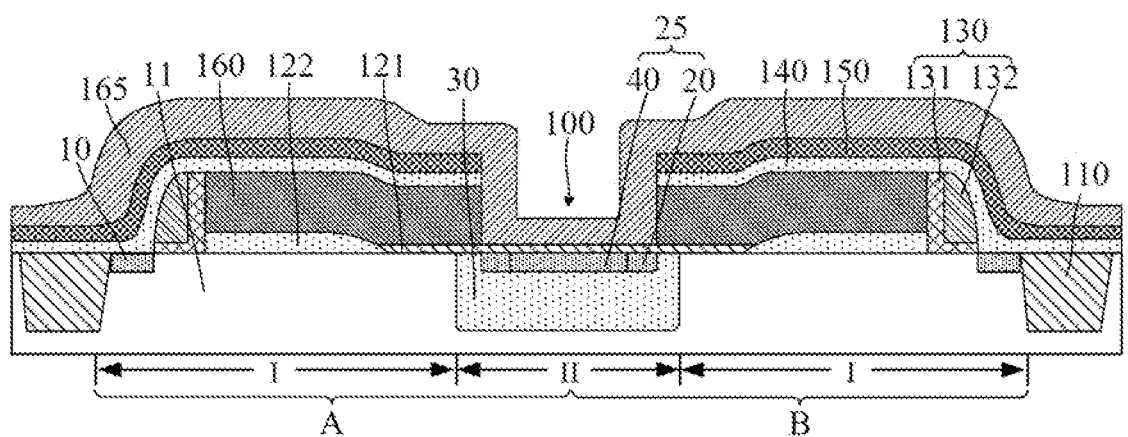
Figure 7:
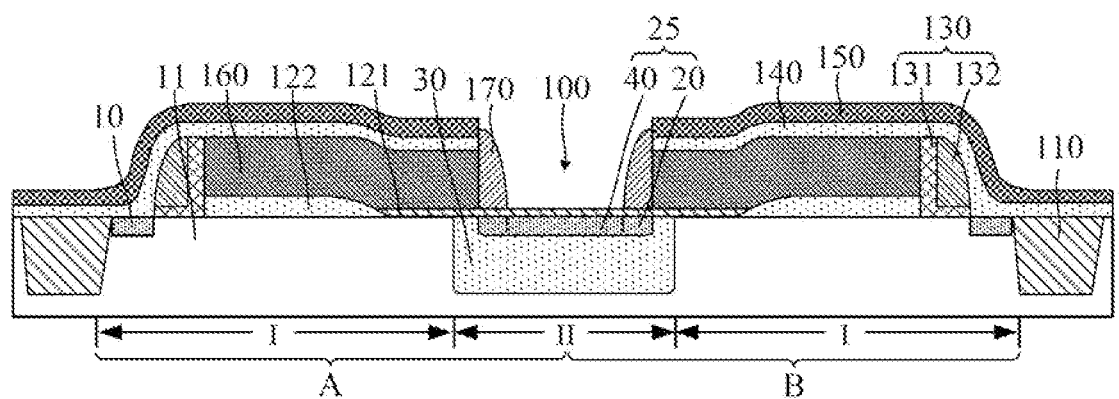

With reference to FIG. 6 and FIG. 7, in some implementations, after the doped region 25 is formed and before the trench is formed, the method for forming a semiconductor structure further includes: a spacer 170 is formed on a side wall of the opening 100. A bottom of the spacer 170 covers the source region 20 and exposes the sacrificial doped region 40.

The spacer 170 is used as an etching mask for subsequently forming the trench. In particular, by forming of the spacer, the sacrificial doped region 40 and a partial thickness of the base under the sacrificial doped region 40 are etched by using the protective layer 150 and the spacer 170 as masks to form a trench in the body region 30. Correspondingly, during forming of the trench, no additional mask is required, helping to prevent the overlay shift generated during the photolithography process, further reducing production costs, shortening a process cycle, and reducing a processing difficulty and increasing a process window.

In addition, the spacer 170 covers the side wall of the opening 100. In particular, the spacer 170 covers the side wall that is of the gate 160 and that is exposed by the opening 100, so that when a silicide layer located on a surface of the base and on a top surface of the gate 160 is formed, the silicide layer may be prevented from being formed on the side wall that is of the gate 160 and that is exposed by the opening 100, thereby preventing the silicide layer formed on the side wall of the gate 160 from contacting a silicide layer formed on the source region 20.

In some implementations, the spacer 170 is made of tetra-ethyl-ortho-silicate (TEOS). Through selection of the TEOS as the material of the spacer 170, a deposition process with a lower temperature may be used during forming of the spacer 170, helping to reduce heat accumulation and thereby helping to improve device reliability.

In some implementations, the step of forming the spacer 170 includes:

As shown in FIG. 6, a spacer film 165 is formed to conformally cover the protective layer 150, the side wall of the opening 100, and the base under the opening 100. The spacer film 165 is configured to form a spacer through a subsequent etching process.

Subsequently, the spacer film 165 located on the protective layer 150 and on the base under the opening 100 is removed, and the spacer film 165 located on the side wall of the opening 100 is reserved as the spacer. Therefore, in the step of forming the spacer film 165, a thickness of the spacer film 165 should not be excessively small, otherwise a thickness of a remaining spacer film 165 located on the side wall of the opening 100 is excessively small in a subsequent etching process. However, the thickness of the spacer film 165 should not be excessively large, otherwise it is relatively difficult and takes a long time to remove the spacer film 165 located on the protective layer 150 and on the base under the opening 100. Accordingly, in some implementations, a thickness of the spacer film 165 is 300 Å to 3000 Å. Preferably, the thickness of the spacer film 165 is 1000 Å to 1320 Å.

As an example, in some implementations, a process of forming the spacer film 165 includes a sub-atmospheric chemical vapor deposition (SACVD) process. The sub-atmospheric chemical vapor deposition process has better step coverage capability and trench filling capability. A reaction process of the sub-atmospheric chemical vapor deposition process is a pure chemical reaction and generates no plasma damage. In addition, the sub-atmospheric chemical vapor deposition process has a low process temperature to reduce heat accumulation.

In other implementations, other suitable deposition processes may further be used to form the spacer film, for example: a high aspect ratio process (HARP), a plasma enhanced (PE) deposition process, a high-density plasma (HDP) process, and a spin-on coating (SOC) process, etc.

As shown in FIG. 7, the spacer film 165 located on the protective layer 150 and on the base under the opening 100 is removed, and the spacer film 165 located on the side wall of the opening 100 is reserved as the spacer 170.

In some implementations, the spacer film 165 located on the protective layer 150 and on the base under the opening 100 is removed through an anisotropic dry etching process.

In some implementations, by forming of the protective layer 150, the spacer film 165 located on the protective layer 150 and on the base under the opening 100 is removed by using the top surface of the protective layer 150 as a stop layer.

Correspondingly, because the anisotropic dry etching process is characterized with anisotropic etching, in the step of removing the spacer film 165 located on the protective layer 150 and on the base exposed from a layer under the opening 100, an etched thickness of the spacer film 165 located on the protective layer 150 and on the base under the opening 100 is greater than a laterally etched thickness of the spacer film 165 located on the side wall of the opening 100, thereby causing a partial thickness of the spacer film 165 located on the side wall of the opening 100 to be reserved as the spacer 170. In addition, by disposing of the protective layer 150, the spacer film 165 located on the protective layer 150 and on the base under the opening 100 is removed without a mask in some implementations, so that the spacer 170 is formed without additional mask, helping to prevent overlay shift during the photolithography process, and correspondingly helping to increase a process window for forming the spacer 170, and further helping to reduce process costs and shortening a production cycle.

Figure 8:
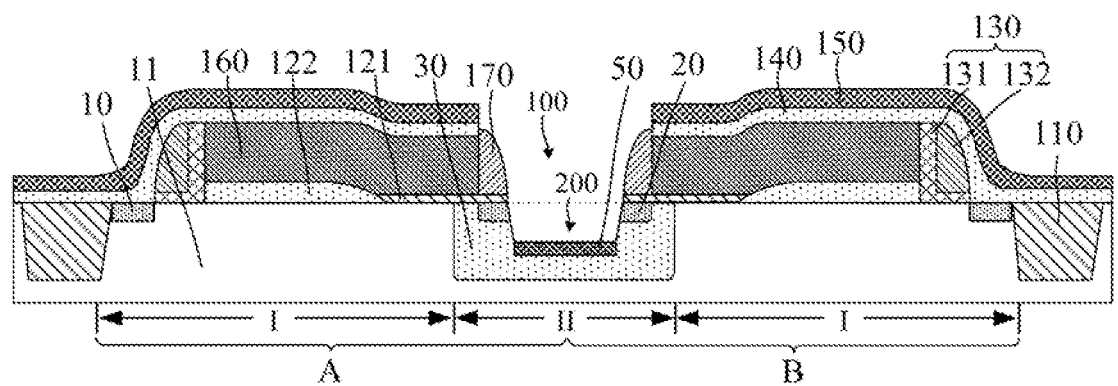

Referring to FIG. 8, the sacrificial doped region 40 and a partial thickness of the base under the sacrificial doped region 40 are etched by using the protective layer 150 as a mask, and a trench 200 is formed in the body region 30. A side wall of the trench 200 exposes the source region 20.

By forming of the trench 200 in the body region 30, a trench body is formed. Therefore, when the semiconductor structure formed in embodiments and implementations of the present disclosure is in operation, a carrier is not only transmitted through a surface of the base, but also transmitted through the side wall of the trench 200, helping to transmit more carriers and improving a carrier mobility, thereby helping to reduce an on-resistance of the device, improving a response speed of the device, and correspondingly improving performance of the LDMOS device. In particular, a response speed of the device formed in this embodiment is improved by about 10%.

In addition, the protective layer 150 may be used as a mask during forming of the trench 200, helping to simplify a process flow and shorten the process cycle. Moreover, by forming of the protective layer 150, no additional mask is used during forming of the trench 200, not only helping to save process costs and shorten a process cycle, but also helping to prevent overlay shift generated during the photolithography process, further helping to reduce a process difficulty and increase a process window.

A side wall of the trench 200 exposes the source region 20, so that a conductive plug in contact with the source region 20 may be formed on the side wall of the trench 200, and an electric connection between the source region 20 and an external circuit or other interconnecting structures is correspondingly achieved.

A depth of the trench 200 should neither be excessively small nor excessively large. If the depth of the trench 200 is excessively small, an effect for improving the carrier mobility by the trench 200 is easily reduced. If the depth of the trench 200 is excessively large, a subsequent step further includes filling the trench 200 with a material, easily increasing a difficulty in filling the trench 200 with a material. Accordingly, as an example, in some implementations, the trench 200 has a depth of 500 Å to 4000 Å. Preferably, the trench 200 has the depth of 1800 Å to 2200 Å.

As an example, an angle between the side wall of the trench 200 and a bottom of the trench 200 is an obtuse angle. Preferably, the angle between the side wall of the trench 200 and the bottom of the trench 200 is 92° to 108°. That the angle between the side wall of the trench 200 and a bottom of the trench 200 is an obtuse angle may reduce a difficulty in filling the trench 200 with a material, reducing a probability of a void and other defects generated in the filled material.

In some implementations, the step of forming the trench 200 includes: The sacrificial doped region 40 exposed from the spacer 170 and a partial thickness of the base under the sacrificial doped region 40 are etched to form the trench 200.

In particular, in some implementations, the step of forming the trench 200 includes: The partial thickness of the base located in the sacrificial doped region 40 and under the sacrificial doped region 40 is etched by using the protective layer 150 and the spacer 170 as masks.

In some implementations, by disposing of the protective layer 150 and the spacer 170, the protective layer 150 and the spacer 170 may be used as etching masks for forming the trench 200, and accordingly no additional mask is required, helping to prevent overlay shift generated during a photolithography process, thereby helping to increase a process window for forming the trench 200, reduce a process difficulty, save process costs, and shorten a process cycle.

In some implementations, the partial thickness of the base located in sacrificial doped region 40 and under the sacrificial doped region 40 is etched through an anisotropic dry etching process by using the protective layer 150 and the spacer 170 as masks to form the trench 200. The anisotropic dry etching process is characterized with anisotropic etching, helping to improve the cross-sectional profile quality of the trench 200.

In some implementations, during forming of the trench 200, a first oxide layer 121 located on the base of the sacrificial doped region 40 is further removed.

Still referring to FIG. 8, in some implementations, after the trench 200 is formed, the method for forming a semiconductor structure further includes: a body-region contact region 50 is formed in the body region 30 at a bottom of the trench 200, a doping type of the body-region contact region 50 being the same as a doping type of the body region 30.

The body-region contact region 50 is used as a signal connector of the body region 30 to achieve an electric connection between the body region 30 and an external circuit or other interconnecting structures. In addition, a second silicide layer is formed at the bottom and on the side wall of the trench 200 to cause the body-region contact region 50 to be electrically connected to the source region 20.

A doping type of the body-region contact region 50 is the same as a doping type of the body region 30, and a doping concentration of the body-region contact region 50 is greater than a doping concentration of the body region 30, so that the body-region contact region 50 is a heavily doped region, helping to improve quality of subsequently forming of a second silicide layer formed at the bottom and on the side wall of the trench 200. In addition, a source plug in contact with the second silicide layer is formed subsequently. The body-region contact region 50 is a heavily doped region, helping to reduce a contact resistance between the source plug and the body-region contact region 50.

In some implementations, a doped ion in the body-region contact region 50 is a P-type ion. In other implementations, the doped ion in the body-region contact region may further be an N-type ion.

In some implementations, fourth ion doping is performed on the body region 30 at the bottom of the trench 200 by using the protective layer 150 and the spacer 170 as the masks to form the body-region contact region 50.

Correspondingly, in some implementations, no additional mask is formed for the fourth ion doping, helping to prevent overlay shift during the photolithography process, correspondingly helping to increase a process window for forming the body-region contact region 50, and simultaneously helping to save process costs and simplify working procedures.

In some implementations, the fourth ion doping is performed through an ion implantation process.

Figure 9:
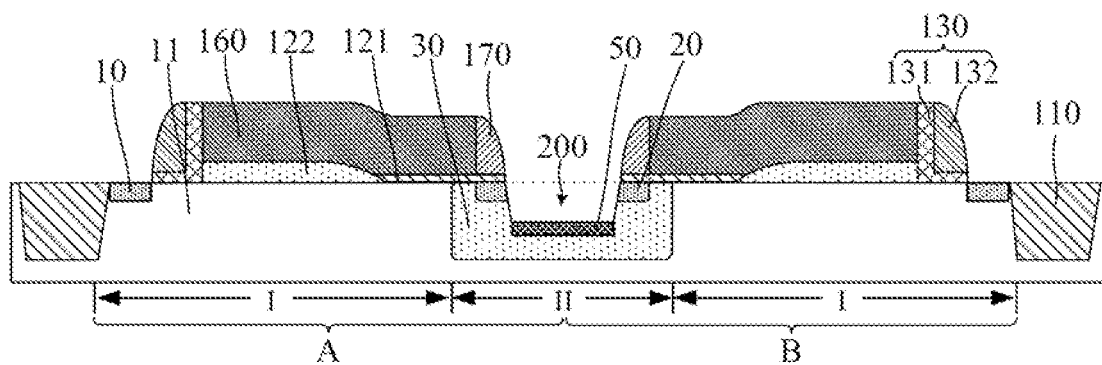

With reference to FIG. 9, in some implementations, after the trench 200 is formed, the method for forming a semiconductor structure further includes: the protective layer 150 is removed. The protective layer 150 is removed to expose a buffer layer 140, thereby making preparation for subsequently removing or patterning the buffer layer 140.

In particular, in some implementations, after the body-region contact region 50 is formed, the protective layer 150 is removed.

In some implementations, a process of removing the protective layer 150 includes a wet etching process. As an example, the protective layer 150 is made of silicon nitride, and an etching solution of the wet etching process includes a phosphoric acid solution.

Still referring to FIG. 9, after the protective layer 150 is removed, the method for forming a semiconductor structure further includes: the buffer layer 140 is removed. The buffer layer 140 is removed to expose a top surface of the gate 160, thereby making preparation for subsequently forming a third silicide layer on the top surface of the gate 160.

In some implementations, the buffer layer 140 is removed through a dry etching process and a wet etching process in sequence.

In other implementations, after the protective layer is removed, according to actual process requirements, the method for forming a semiconductor structure further includes: the buffer layer is patterned, and a part of the buffer layer is reserved as a blocking layer.

By patterning of the buffer layer and reserving of the part of the buffer layer as the blocking layer, a region and position in which a subsequent third silicide layer is formed may be defined according to actual process requirements. Correspondingly, after a gate plug is subsequently formed on the third silicide layer, different contact resistances may be disposed between the gate plug and the gate.

Figure 10:
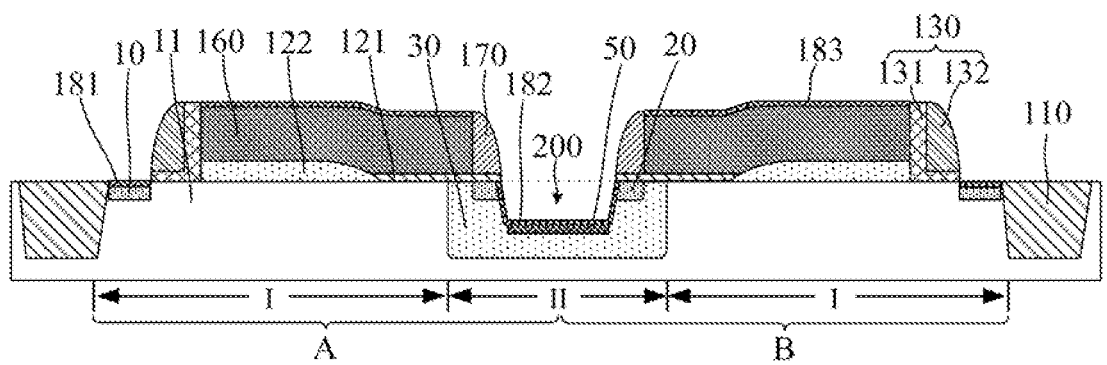

Referring to FIG. 10, in some implementations, after the buffer layer 140 is removed, the method for forming a semiconductor structure further includes: a first silicide layer 181 is formed on a top surface of the drain region 10, a second silicide layer 182 is formed at the bottom and on the side wall of the trench 200, and a third silicide layer 183 is formed on the top surface of the gate 160.

A subsequent step further includes: a drain plug in contact with the drain region 10 is formed, the first silicide layer 181 being located between the drain region 10 and the drain plug, helping to increase adhesion between the drain region 10 and the drain plug, reducing the contact resistance between the drain region 10 and the drain plug, thereby improving performance of contact between the drain region 10 and the drain plug.

A subsequent step further includes: a source plug in contact with the source region 20 is formed, the second silicide layer 182 being located on the side wall and at the bottom of the trench 200, that is, the second silicide layer 182 being located on a surface of a source region 20 exposed from the side wall of the trench 200, helping to increase adhesion between the source region 20 and the source plug and reduce a contact resistance between the source region 20 and the source plug, thereby improving performance of contact between the source region 20 and the source plug.

A subsequent step further includes: a gate plug in contact with the gate 160 is formed, the third silicide layer 183 being located on the top surface of the gate 160, helping to increase adhesion between the gate 160 and the gate plug and reduce a contact resistance between the gate 160 and the gate plug, thereby improving performance of contact between the gate 160 and the gate plug.

In some implementations, the first silicide layer 181, the second silicide layer 182, and the third silicide layer 183 are made of a same material, and the first silicide layer 181, the second silicide layer 182, and the third silicide layer 183 may be made of a material such as TiSi, NiSi, or CoSi.

A subsequent step further includes: a drain plug electrically connected to the drain region 10 is formed on the first silicide layer 181, a source plug electrically connected to the source region 20 is formed on the second silicide layer 182, and gate plug electrically connected to the gate 160 is formed on the third silicide layer 183. Steps of the subsequent process are not described in detail herein again in this embodiment.

Correspondingly, the present disclosure further provides a semiconductor structure. Referring to FIG. 8, a schematic cross-sectional structural diagram of one form of a semiconductor structure according to the present disclosure is shown.

The semiconductor structure includes: a base including a drift region 11 and a body region 30 adjacent to each other; a gate 160 located on the base and covering a junction between the drift region 11 and the body region 30, a part of the base being exposed on both sides of the gate 160; a drain region 10 located in the drift region 11 on a side of the gate 160; a protective layer 150 conformally covering the drain region 10, the top surface of the gate 160, and a side wall that is of the gate 160 and that is adjacent to the drain region 10; an opening 100 enclosed by the side wall of the gate 160 and a partial width of the base away from the body region 30; a source region 20 located in a part of the body region 30 under the opening 100 and adjacent to the gate 160; and a trench 200 located on the partial thickness of the body region 30 exposed from protective layer 150 and the source region 20, a side wall of the trench 200 exposing the source region 20.

By disposing of the trench 200 in the body region 30, a trench body is introduced in the semiconductor structure. Therefore, when forms of the semiconductor structure provided in embodiments and implementations of the present disclosure is in operation, a carrier is not only transmitted through a surface of the base, but also transmitted through the side wall of the trench 200, helping to transmit more carriers and improving a carrier mobility, thereby helping to reduce an on-resistance of the device, improving a response speed of the device, and correspondingly improving performance of the LDMOS device. In particular, a response speed of the device formed in this implementation is improved by about 10%.

In some implementations, by disposing of the protective layer 150, the protective layer 150 may be used as a mask during forming of the trench 200, helping to simplify a process flow and shorten a process cycle. Moreover, by disposing of the protective layer 150, no additional mask is used during forming of the trench 200, not only helping to save the process costs and shorten the process cycle, but also helping to prevent overlay shift generated during the photolithography process, further helping to reduce a process difficulty and increase a process window.

The base provides a process platform for forming the LDMOS device. As an example, the base is configured to form an N-type LDMOS transistor. In other implementations, the base may further be configured to form a P-type LDMOS transistor.

In some implementations, for example, the base is a planar base. In other implementations, the base may further be a three-dimensional base, for example: the base includes a substrate and a fin separated on the substrate.

In some implementations, the base includes a first sub-device region A and a second sub-device region B adjacent to each other. The first sub-device region A and the second sub-device region B both include the drift region 11 and the body region 30. The first sub-device region A and the second sub-device region B share the body region 30. In particular, the first sub-device region A and the second sub-device region B further share the trench 200.

That the first sub-device region A and the second sub-device region B share the body region 30 and the trench 200 helps to reduce an area occupied by the semiconductor structure.

In some implementations, the first sub-device region A and the second sub-device region B constitute a device unit region.

The semiconductor structure further includes: an isolation structure 110 located in the base on a periphery of a device unit region and configured to isolate adjacent device unit regions.

In some implementations, the isolation structure 110 is made of silicon oxide.

An ion doping concentration in the drift region 11 is relatively low, so that a resistance of the drift region 11 is relatively high, and thus has a relatively high voltage withstand capability.

A type of a doped ion in the drift region 11 is the same as a type of a doped ion of the LDMOS transistor. In some implementations, an N-type LDMOS transistor is formed, and the doped ion in the drift region 11 is an N-type ion. In other implementations, when a P-type LDMOS transistor is formed, a doped ion in the drift region is a P-type ion.

The body region 30 is configured to form a conductive channel with a concentration gradient. In particular, a part that is of the body region 30 and that is covered by the gate 160 is configured to form an effective channel region.

The type of the doped ion in the body region 30 is different from the type of the doped ion of the LDMOS transistor. In some implementations, the N-type LDMOS transistor is formed, and a doped ion in the body region 30 is the P-type ion. In other implementations, when a P-type LDMOS transistor is formed, the doped ion in the body region is correspondingly the N-type ion.

When the device is in operation, the gate 160 is configured to control opening or closing of a conductive channel.

The gate 160 covers a junction between the body region 30 and the drift region 11, so that a part of the body region 30 covered by the gate 160 may be used as an effective channel region.

As an example, In some implementations, the gate 160 is made of polysilicon.

In some implementations, the semiconductor structure further includes: a first oxide layer 121 located between the base of the second region II and the gate 160 and extending to be between the base of a part of the first region I and the gate 160; a second oxide layer 122 located between the base of the first region I and the gate 160 and adjacent to the first oxide layer 121. A thickness of the second oxide layer 122 is greater than a thickness of the first oxide layer 121. The first oxide layer 121 is further located between a spacer 170 and the base.

The first oxide layer 121 and the second oxide layer 122 are configured to achieve electric isolation between the gate 160 and the base.

Compared with the first oxide layer 121, the second oxide layer 122 is closer to the drain region 10. The drain region 10 is usually connected to a relatively high voltage. A thickness of the second oxide layer 122 is greater than a thickness of the first oxide layer 121, so that the area between the gate 160 and the substrate close to the drain region 10 is more difficult to break down and the base, helping to improve capability of resistance to breakdown of the device and correspondingly improving reliability of the device.

In some implementations, the first oxide layer 121 and the second oxide layer 122 are made of silicon oxide.

In some implementations, the semiconductor structure further includes: a spacer structure layer 130 located on a side wall that is of the gate 160 and that is opposite to the opening 100.

The spacer structure layer 130 is configured to protect the side wall of the gate 160. The spacer structure layer 130 is further configured to define a region in which the drain region 10 is formed. Therefore, the spacer structure layer 130 further exposes a part of the drift region 11. The drain region 10 is located in the drift region 11 exposed from the spacer structure layer 130.

In some implementations, the spacer structure layer 130 may be made of one or more of silicon oxide, silicon nitride, silicon carbide, silicon carbonitride, silicon oxycarbonitride, silicon oxynitride, boron nitride, and boron carbonitride, and the spacer structure layer 130 may be a single-layer structure or a laminated-layer structure.

In some implementations, the spacer structure layer 130 is a laminated-layer structure. The spacer structure layer 130 includes a first spacer layer 131 located on the side wall of the gate 160 and extending to a part of the base, and a second spacer layer 132 located on the first spacer layer 131. The second spacer layer 132 covers the first spacer layer 131 located on the base.

A type of a doped ion in the drain region 10 is the same as a type of a doped ion of an LDMOS transistor.

In some implementations, the base is configured to form an N-type LDMOS transistor, and a doped ion in the drain region 10 is an N-type ion. The N-type ion includes a P-type ion, an As ion, or a Sb ion. In other implementations, when the base is configured to form a P-type LDMOS transistor, the doped ion in the drain region is the P-type ion. The P-type ion includes a B ion, a Ga ion, or an In ion.

The protective layer 150 is configured to protect a top surface of the gate 160 and the drain region 10. The protective layer 150 is further used as a mask for performing ion doping to form a body region 30. In some implementations, the semiconductor structure further includes a spacer 170 located on a side wall of the opening 100 and covering the source region 20. The protective layer 150 may further be used as a stop layer during forming of the spacer 170. The protective layer 150 may further be used as an etching mask for forming a trench 200.

In some implementations, the protective layer 150 conformally covers the drain region 10, a top surface of the gate 160, and a side wall of the spacer structure layer 130.

In some implementations, the protective layer 150 is made of silicon nitride. The silicon nitride, the material of the base, and the material of the gate 160 have great etch selectivity, helping to ensure that the protective layer 150 may protect the gate 160 and the base.

The semiconductor structure further includes: a buffer layer 140 located between the protective layer 150 and the top surface of the gate 160, between the protective layer 150 and the base, between the protective layer 150 and the drain region 10, and between the protective layer 150 and the spacer structure layer 130.

The protective layer 150 may be removed subsequently, and the buffer layer 140 may be used as a stop layer during subsequent removal of the protective layer 150, thereby protecting the gate 160 and the base. In addition, a third silicide layer is formed on the top surface of the gate 160 subsequently. After the buffer layer 140 is formed, a part of the buffer layer 140 is reserved according to actual needs after the protective layer is subsequently removed, thereby defining a region in which the third silicide layer is formed.

In some implementations, the buffer layer 140 is made of silicon rich oxide.

In some implementations, a side wall of an opening 100 located in the first sub-device region A is in communication with a side wall of the opening 100 located in the second sub-device region A.

The source region 20 is used as a source of the LDMOS device.

A doping type of the source region 20 is the same as a doping type of the LDMOS transistor. In some implementations, an N-type LDMOS transistor is formed, and a doped ion in the source region 20 is an N-type ion. The N-type ion includes a P-type ion, an As ion, or a Sb ion, etc. 20. In other implementations, when a P-type LDMOS transistor is formed, the doped ion in the source region is the P-type ion. The P-type ion includes a B ion, a Ga ion, or an In ion, etc.

In some implementations, the semiconductor structure further includes: a spacer 170 located on the side wall of the opening 100, a bottom of the spacer 170 covering the source region 20.

The spacer 170 is used as an etching mask for forming the trench 200. In particular, by disposing of the spacer 170, the protective layer 150 and the spacer 170 may be used as an etching mask for forming the trench 200 and as a mask for forming a body-region contact region 50, so that no additional mask is required during forming of the trench 200 and a forming of the body-region contact region 50, helping to prevent overlay shift during a photolithography process, and further helping to save process costs and shorten a process cycle.

In addition, the spacer 170 covers the side wall of the opening 100. In particular, the spacer 170 covers the side wall that is of the gate 160 and that is exposed from the opening 100, so that when a silicide layer is formed on the surface of the base and on a top surface of the gate 160, the silicide layer may be prevented from being formed on the side wall that is of the gate 160 and that is exposed from the opening 100, thereby preventing the silicide layer formed on the side wall of the gate 160 from contacting a silicide layer formed on the source region 20.

In some implementations, the spacer 170 is made of tetra-ethyl-ortho-silicate. Through selection of the tetra-ethyl-ortho-silicate as the material of the spacer 170, a deposition process with a lower temperature may be used during forming of the spacer 170, helping to reduce heat accumulation and thereby helping to improve device reliability.

As an example, in some implementations, a thickness of the spacer 170 is 500 Å to 1000 Å. Preferably, the thickness of the spacer 170 is 585 Å to 715 Å. The thickness of the spacer 170 is relatively small, so that after a source plug electrically connected to the source region 20 is formed later, a distance by which the carrier is transmitted from the drain region 10 to the source plug is relatively short, helping to shorten a conduction path of the carrier, correspondingly helping to reduce a resistance of an LDMOS device, and improving performance of the semiconductor structure.

The trench 200 is located in the base of the partial thickness of the body region 30 exposed from the protective layer 150 and the source region 20, thereby introducing a trench body in the LDMOS device, helping to reduce an on-resistance of the device and improve a response speed of the device.

In particular, the trench 200 is located in the base of the partial thickness of the body region 30 exposed from the protective layer 150 and the spacer 170. The trench 200 is formed by etching the partial thickness of the body region with the protective layer 150 and the spacer 170 as masks.

A side wall of the trench 200 exposes the source region 20, so that a conductive plug in contact with the source region 20 may be formed on the side wall of the trench 200, and an electric connection between the source region 20 and an external circuit or other interconnecting structures is correspondingly achieved.

A depth of the trench 200 should neither be excessively small nor excessively large. If the depth of the trench 200 is excessively small, an effect for improving the carrier mobility by the trench 200 is easily reduced. If the depth of the trench 200 is excessively large, the trench 200 is further subsequently filled with a material, easily increasing a difficulty in filling the trench 200 with the material. Accordingly, as an example, In some implementations, the trench 200 has a depth of 500 Å to 4000 Å. Preferably, the trench 200 has the depth of 1800 Å to 2200 Å.

As an example, an angle between the side wall of the trench 200 and a bottom of the trench 200 is an obtuse angle. Preferably, the angle between the side wall of the trench 200 and the bottom of the trench 200 is 92° to 108°. That the angle between the side wall of the trench 200 and a bottom of the trench 200 is an obtuse angle may reduce a difficulty in filling the trench 200 with a material, reducing a probability of a void and other defects generated in the filled material.

In some implementations, the semiconductor structure further includes: a body-region contact region 50 located in the body region 30 at a bottom of the trench 200, a doping type of the body-region contact region 50 being the same as a doping type of the body region 30.

In particular, the body-region contact region 50 is located in the body region 30 at the bottom of the trench 200, so that the body-region contact region 50 is lower than the source region 20.

The body-region contact region 50 is used as a signal connector of the body region 30 to achieve an electric connection between the body region 30 and an external circuit or other interconnecting structures. In addition, a second silicide layer is formed at the bottom and on the side wall of the trench 200 to cause the body-region contact region 50 to be electrically connected to the source region 20.

A doping type of the body-region contact region 50 is the same as a doping type of the body region 30, and a doping concentration of the body-region contact region 50 is greater than a doping concentration of the body region 30, so that the body-region contact region 50 is a heavily doped region, helping to improve quality of subsequently forming of a second silicide layer formed at the bottom and on the side wall of the trench 200. In addition, a source plug in contact with the second silicide layer is formed subsequently. The body-region contact region 50 is a heavily doped region, helping to reduce a contact resistance between the source plug and the body-region contact region 50.

A doping type of the body-region contact region 50 is the same as a doping type of the body region 30. In some implementations, a doped ion in the body-region contact region 50 is a P-type ion. In other implementations, the doped ion in the body-region contact region may further be an N-type ion.

The semiconductor structure may be formed in the forming method described in the foregoing embodiments, or may be formed in other forming methods. For detailed descriptions of the semiconductor structure In some implementations, reference may be made to the corresponding descriptions in the foregoing embodiments, and details are not described herein again in this embodiment.

Although the present disclosure is disclosed as above, the present disclosure is not limited thereto. A person skilled in the art may make variations and modifications without departing from the spirit and scope of the present disclosure. Therefore, the protection scope of the present disclosure should be subject to the claims.

What is claimed is:

1. A method for forming a semiconductor structure, comprising:
    providing a base comprising a first region in which a drift region is formed and a second region in which a body region is formed, the first region being adjacent to the second region;
    forming an initial gate on the base, the initial gate covering the second region and extending to cover a part of the first region;
    forming a drain region in the first region on a side of the initial gate;
    forming a protective film conformally covering the drain region, a top surface and a side wall of the initial gate, and a surface of the base;
    removing a partial width of the protective film and a partial width of the initial gate of the second region to form a protective layer, a gate, and an opening enclosed by a side wall of the gate and a partial width of the base of the second region, the gate covering a junction between the second region and the first region;
    performing first ion doping on the base under the opening and forming a body region in the base of the second region;
    performing second ion doping on the base under the opening, where a doping type of the second ion doping is different from a doping type of the first ion doping, and forming a doped region in the body region under the opening, where the doped region comprises a sacrificial doped region and a source region between the sacrificial doped region and the gate; and
    etching the sacrificial doped region and a partial thickness of the base under the sacrificial doped region using the protective layer as a mask, and forming a trench in the body region, a side wall of the trench exposing the source region.

2. The method for forming a semiconductor structure according to claim 1, wherein after forming a doped region and before forming a trench, the method for forming a semiconductor structure further comprises:
    forming a spacer on a side wall of the opening, where a bottom of the spacer covers the source region and exposes the sacrificial doped region; and
    etching the sacrificial doped region and the partial thickness of the base under the sacrificial doped region by using the protective layer and the spacer as masks.

3. The method for forming a semiconductor structure according to claim 2, wherein the sacrificial doped region and the partial thickness of the base under the sacrificial doped region are etched through an anisotropic dry etching process using the protective layer and the spacer as the masks.

4. The method for forming a semiconductor structure according to claim 2, wherein the step of forming a spacer comprises:
   forming a spacer film conformally covering the protective layer, the side wall of the opening, and the base under the opening; and
   removing the spacer film located on the protective layer and on the base under the opening, and reserving, as the spacer, the spacer film located on the side wall of the opening.

5. The method for forming a semiconductor structure according to claim 4, wherein the spacer film located on the protective layer and on the base under the opening is removed through an anisotropic dry etching process.

6. The method for forming a semiconductor structure according to claim 4, wherein a process of forming the spacer film comprises a sub-atmospheric chemical vapor deposition process.

7. The method for forming a semiconductor structure according to claim 2, wherein the spacer is made of tetra-ethyl-ortho-silicate.

8. The method for forming a semiconductor structure according to claim 1, further comprising:
   forming a body-region contact region in the body region at the bottom of the trench, a doping type of the body-region contact region being the same as a doping type of the body region; and
   removing the protective layer after the body-region contact region is formed.

9. The method for forming a semiconductor structure according to claim 8, wherein a process of removing the protective layer comprises a wet etching process.

10. The method for forming a semiconductor structure according to claim 1, wherein the base comprises a first sub-device region and a second sub-device region adjacent to each other, the first sub-device region and the second sub-device region sharing the second region.

\* \* \* \* \*